US008402449B1

(12) United States Patent
Biswas et al.

(10) Patent No.: US 8,402,449 B1
(45) Date of Patent: Mar. 19, 2013

(54) TECHNIQUE FOR AUTOMATICALLY ASSIGNING PLACEMENT FOR PIPELINE REGISTERS WITHIN CODE GENERATED FROM A PROGRAM SPECIFICATION

(75) Inventors: Partha Biswas, Framingham, MA (US); Vijaya Raghavan, Framingham, MA (US); Zhihong Zhao, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 1247 days.

(21) Appl. No.: 11/972,117

(22) Filed: Jan. 10, 2008

(51) Int. Cl.
*G06F 9/45* (2006.01)

(52) U.S. Cl. ......... 717/146; 717/152; 717/153; 717/106

(58) Field of Classification Search .......... 717/106–109, 717/146–153
See application file for complete search history.

(56) References Cited

U.S. PATENT DOCUMENTS

| | | | | |
|---|---|---|---|---|
| 5,557,797 | A | 9/1996 | Yano | |
| 6,651,247 | B1 * | 11/2003 | Srinivasan | 717/161 |
| 6,983,456 | B2 | 1/2006 | Poznanovic et al. | |
| 7,000,213 | B2 | 2/2006 | Banerjee et al. | |
| 7,107,199 | B2 | 9/2006 | Schreiber et al. | |
| 7,123,970 | B1 * | 10/2006 | Stroomer | 700/17 |
| 2003/0188299 | A1 * | 10/2003 | Broughton et al. | 717/141 |
| 2003/0200540 | A1 * | 10/2003 | Kumar et al. | 717/161 |
| 2004/0073899 | A1 * | 4/2004 | Luk et al. | 717/158 |
| 2006/0064669 | A1 | 3/2006 | Ogilvie et al. | |
| 2006/0064670 | A1 | 3/2006 | Linebarger et al. | |

OTHER PUBLICATIONS

Wang et al., Hardware/Software Instruction Set Configurability for System-on-Chip Processors, 2001 ACM, pp. 1-5.*

Smelyanskiy, Register Queues: A New Hardware/Software Approach to Efficient Software Pipelining, 2000 IEEE, pp. 1-10.*

Philip Sweany, Post-Compaction Register Assignment in a Retargetable Compiler, 1990 IEEE, pp. 107-116.*

Haldar, Malay, et al., "Automated Synthesis of Pipelined Designs on FPGAS for Signal and Image Processing Applications Described in Matlab®," IEEE, 2001, pp. 645-648.

Yoo, Heejin, et al., "Scheduling Algorithm Pipelined Data Path Synthesis with Grandual Mobility Reduction," IEEE, 1999, pp. 51-54.

"Simulink® HDL Coder: User's Guide vol. 1," The MathWorks, Inc., Sep. 2006, pp. 1-301.

"Simulink®: Using Simulink® Version 6," The MathWorks, Inc., Sep. 2005, pp. 1-711.

Haldar, Malay, et al. "Scheduling Algorithms for Automated Synthesis of Pipelined Designs on FPGAs for Applications Described in MATLAB®", Cases'00, Proceedings of the 2000 International Conference on Compilers, Architecture, and Synthesis for Embedded Systems, San Jose, CA, Nov. 17-19, 2000, pp. 85-92.

Mei, Bingfeng, et al., "A Hardware-Software Partitioning and Scheduling Algorithm for Dynamically Reconfigurable Embedded Systems," 2000, pp. 1-7.

(Continued)

*Primary Examiner* — Wei Zhen
*Assistant Examiner* — Satish Rampuria
(74) *Attorney, Agent, or Firm* — Cesari and McKenna, LLP; Michael R. Reinemann

(57) ABSTRACT

A system and method automatically inserts pipelines into a high-level program specification. An Intermediate Representation (IR) builder creates one or more graphs or trees based on the high-level program specification. A scheduler iteratively applies a bounded scheduling algorithm to produce an execution schedule for the IR minimizing overall execution time for a given number of pipeline stages. A Hardware Description Language (HDL) code generator may utilize the pipelined, scheduled IR to generate optimized HDL code corresponding to the high-level program specification. An annotated version of the high-level program specification showing where the pipelines have been inserted may be displayed allowing additional design exploration.

20 Claims, 12 Drawing Sheets

OTHER PUBLICATIONS

Walker, Robert A., et al., "Introduction to the Scheduling Problem," IEEE Design & Test of Computers, IEEE, Summer 1995, pp. 60-69.

"Filter Design HDL Coder 2: User's Guide," The MathWorks, Inc., Sep. 2007, all pages, pp. 1-395.

Arato, Peter, et al., "Systematic VHDL Code Generation Using Pipeline Operations Produced by High Level Synthesis," IEEE International Symposium on Volume, IEEE, Sep. 4-6, 2003, pp. 191-196.

* cited by examiner

800

```
function out = fcn(c1, in1, in2, in3, in4, in5, in6, in7, in8)

t1 = in1 * in2;
t2 = in3 * in4;
t3 = t1 * t2;
t4 = in5 * in6;
t5 = in7 * in8;

if(c1)
  out = t3 * t4;
else
  out = t3 * t5;
end
```

```
function out = fcn(c1, in1, in2, in3, in4, in5, in6, in7, in8)

909 { persistent pipe_var1_0_1; % Pipeline register from stage 0 to 1 ~902
    if(isempty(pipe_var1_0_1))
      pipe_var1_0_1 =int8(0);
    end
    persistent pipe_var2_0_1; % Pipeline register from stage 0 to 1 ~903
    if(isempty(pipe_var2_0_1))
      pipe_var2_0_1 =int8(0);
    end
    persistent pipe_var3_1_2; % Pipeline register from stage 1 to 2 ~904
    if(isempty(pipe_var3_1_2))
      pipe_var3_1_2 =int16(0);
    end
    persistent pipe_var4_1_2; % Pipeline register from stage 1 to 2 ~905
    if(isempty(pipe_var4_1_2))
      pipe_var4_1_2 =int16(0);
    end
    persistent pipe_var5_1_2; % Pipeline register from stage 1 to 2 ~906
    if(isempty(pipe_var5_1_2))
      pipe_var5_1_2 =int16(0);
    end

    persistent pipe_var6_0_1; % Pipeline register from stage 0 to 1 ~907
    if(isempty(pipe_var6_0_1))
      pipe_var6_0_1 =int16(0);
    end
    persistent pipe_var7_0_1; % Pipeline register from stage 0 to 1 ~908
    if(isempty(pipe_var7_0_1))
      pipe_var7_0_1 =int16(0);
    end }
t1 = in1 * in2;
t2 = in3 * in4;
t3 = pipe_var1_0_1 * pipe_var2_0_1; ~910
t4 = in5 * in6;
t5 = in7 * in8;
temp_var1 = pipe_var3_1_2 * pipe_var4_1_2; ~911
temp_var2 = pipe_var3_1_2 * pipe_var5_1_2; ~912
if(c1)
  out = temp_var1;
else
  out = temp_var2;
end
914 { pipe_var1_0_1 = t1;
    pipe_var2_0_1 = t2;

    pipe_var3_1_2 = t3;

    pipe_var4_1_2 = pipe_var6_0_1;
    pipe_var6_0_1 = t4;

    pipe_var5_1_2 = pipe_var7_0_1;
    pipe_var7_0_1 = t5; }
```

FIG. 9

TECHNIQUE FOR AUTOMATICALLY ASSIGNING PLACEMENT FOR PIPELINE REGISTERS WITHIN CODE GENERATED FROM A PROGRAM SPECIFICATION

BACKGROUND OF THE INVENTION

1. Field of the Invention

The present invention relates to code generation and, more specifically, to generating optimized code.

2. Background Information

Engineers and scientists often use computer-based, high-level development tools or environments to perform algorithm development, data visualization, simulation, and model design, among other tasks. Exemplary high-level development tools include the MATLAB® and Simulink® technical computing environments from The MathWorks, Inc. of Natick, Mass. With the Simulink® technical computing environment, a user creates a graphical model by dragging and dropping blocks from a library browser onto a graphical editor, and connecting them with lines that establish mathematical relationships and/or signals between the blocks. Stateflow® modeling environment is an extension to is the Simulink® technical computing environment that allows users to specify state machines and flow charts. A Stateflow chart may be created by dragging states, junctions and functions from a graphical palette into a drawing window. The user can then create transitions and flow by connecting states and junctions together.

Other add-on products or tools exist for generating code from Simulink models, MATLAB files and/or functions, often referred to as M-files, and/or Stateflow charts. Specifically, a Simulink Hardware Description Language (HDL) Coder™ add-on product, also available from The MathWorks, Inc., generates HDL code based on Simulink models or Stateflow charts. The generated HDL code can be exported to synthesis and layout tools for hardware realization, such as Field Programmable Gate Arrays (FPGAs), Application Specific Integrated Circuits (ASICs), Complex Programmable Logic Devices (CPLDs), etc. With the release of the Simulink HDL Coder add-on product, the Simulink technical computing environment can now be used for electronic design automation.

With the Simulink HDL Coder add-on product, a user may create a code generation control file that is attached to a model. The control file allows the user to set code generation options, such as how HDL code is generated for selected sets of blocks within the model. In this way, the generated HDL code may be optimized for speed, chip area, latency, etc.

SUMMARY OF THE INVENTION

Briefly, the present invention relates to a system and method for optimizing code, such as hardware description language (HDL) code, generated from a program specification created with a high-level development environment. More specifically, the present invention relates to the automatic insertion of pipelines into the generated HDL code to optimize it, e.g., to increase throughput. Pipelining is an implementation technique is where multiple instructions or operations are overlapped in execution to increase throughput. It involves the placement of registers to break-up the computation into multiple units, known as pipeline stages. In an illustrative embodiment, the system includes an Intermediate Representation (IR) builder, a scheduler, a pipeline insertion engine, and an HDL code generator. The IR builder receives the high-level program specification created by a user. The high-level program specification may be a graphical model, a Stateflow chart, etc. The IR builder may create one or more graphs or trees, such as a control data flow graph (CDFG), based on the high-level program specification. The CDFG may include a plurality of interconnected nodes each corresponding to an operation. The scheduler uses a scheduling algorithm to produce an execution schedule for the nodes of the CDFG according to an acceptable solution, such as minimizing overall execution time for the CDFG for a given number of pipeline stages. The number of pipeline stages may be specified by the user. The scheduler further determines where one or more pipeline registers should be inserted into the CDFG. The pipeline insertion engine inserts the pipeline registers in the CDFG. The HDL code generator may utilize the pipelined CDFG to generate optimized HDL code.

In an illustrative embodiment, the scheduler iteratively applies a bounded scheduling algorithm that is bounded or constrained by an input time threshold. The bounded scheduling algorithm may be based on the As Soon As Possible (ASAP) scheduling algorithm. The bounded scheduling algorithm also generates an overall finish time, i.e., the time it takes to execute all of the operations of the CDFG for a given number of pipeline stages. More specifically, the scheduler computes a lower bound for the latency per pipeline stage. The scheduler then generates an execution schedule for the nodes of the CDFG using the bounded scheduling algorithm in which the computed lower bound is used as the input threshold, e.g., as an input time bound. The bounded scheduling algorithm returns an overall finish time, which is the execution time for the pipeline's slowest stage. If the overall finish time matches the lower bound, then an acceptable schedule for the CDFG has been achieved. If not, then the computed overall finish time is utilized as an upper bound and a binary search is performed between the lower bound and the upper bound to obtain a schedule minimizing the overall finish time for the given number of pipeline stages.

In a further embodiment, the system may include a model annotation engine. The model annotation engine receives the scheduled and pipelined CDFG from the scheduler, and produces a new version of the high-level program specification that includes an indication of where in the original program specification the pipelines have been inserted. For example, if the original, high-level program specification is a graphical model, the model annotation engine may produce a new graphical model that further includes icons representing where in the model the pipeline registers have been inserted. The model annotation engine may also be configured to mark the critical path through the graphical model. The annotated program specification may be displayed to the user for additional design exploration and/or refinement.

BRIEF DESCRIPTION OF THE DRAWINGS

The invention description below refers to the accompanying drawings, of which:

FIGS. 8 and 10 are illustrations of exemplary program specifications from high-level programming environments; and FIGS. 9 and 11 are annotated versions of the program specifications of FIGS. 8 and 10.

DETAILED DESCRIPTION OF AN ILLUSTRATIVE EMBODIMENT

Figure 1:
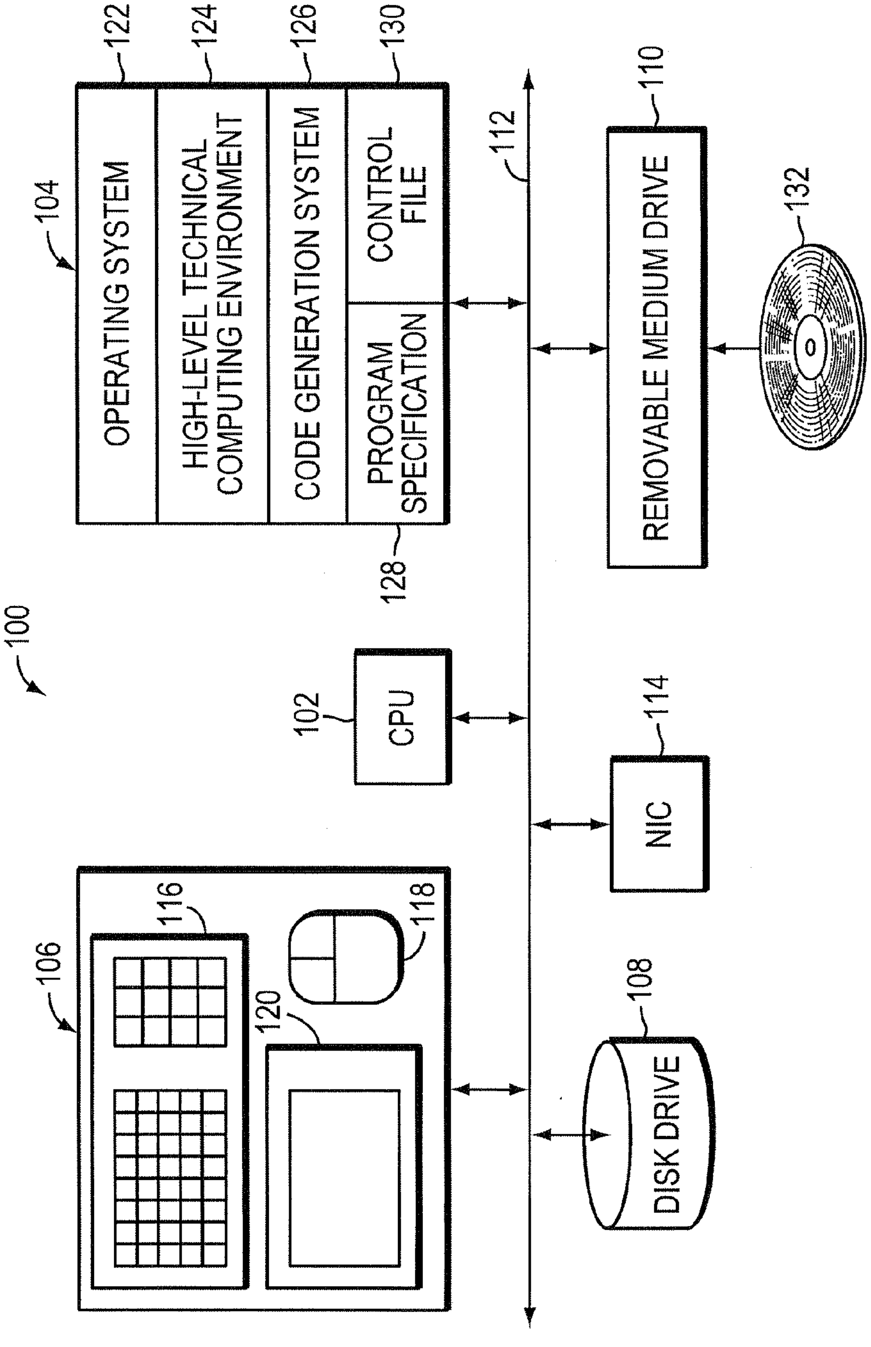
FIG. 1 is a schematic block diagram of a computer system suitable for use with the present invention.

FIG. 1 is a schematic illustration of a computer system 100 for implementing and utilizing an embodiment of the invention. The computer system 100 includes a central processing unit (CPU) 102, a main memory 104, user input/output (I/O) 106, a disk drive 108, and a removable medium drive 110 that are interconnected by a system bus 112. The computer system 100 may also include a network interface card (NIC) 114. The user I/O 106 includes a keyboard 116, a mouse 118 and a display 120.

The main memory 104 stores a plurality of libraries or modules, such as an operating system 122, and one or more applications running on top of the operating system 122, including a technical computing environment 124. The main memory 104 may also include a code generation system 126. The code generation system 126 may be configured as a toolbox or an add-on product to the high-level technical computing environment 124. Furthermore, a user or developer may create and store a program specification 128 and a control file 130. The control file may be stored on disk or represented in the main memory 104.

The removable medium drive 110 is configured to accept and read a computer readable medium 132, such as a CD, DVD, floppy disk, solid state drive, tape, flash memory or other medium. The removable medium drive 110 may further be configured to write to the computer readable medium 130.

Suitable computer systems include personal computers (PCs), workstations, laptops, palm computers and other portable computing devices, etc. Nonetheless, those skilled in the art will understand that the computer system 100 of FIG. 1 is meant for illustrative purposes only and that the present invention may be used with other computer systems, processing systems or computational devices. The present invention may also be used in a networked, e.g., client-server, computer architecture.

Suitable operating systems 122 include the Windows series of operating systems from Microsoft Corp. of Redmond, Wash., the Linux operating system, the MAC OS® series of operating systems from Apple Inc. of Cupertino, Calif., and the UNIX® series of operating system, among others.

As indicated above, a user or developer, such as an engineer, scientist, programmer, etc., may utilize the keyboard 116, the mouse 118 and the computer display 120 of the user I/O 106 to operate the high-level technical computing environment 124, and create the program specification 128 and the control file 130.

Suitable high-level technical computing environments for use with embodiments of the present invention include the MATLAB® and SIMULINK® technical computing environments from The MathWorks, Inc. of Natick, Mass., the LabVIEW programming system from National Instruments Corp. of Austin, Tex., the Visual Engineering Environment (VEE) from Agilent Technologies, Inc. of Santa Clara, Calif., the Khoros development system now from AccuSoft Corp. of Northborough, Mass., a C programming system, a JAVA programming system, and a C++ programming systems, among others. Those skilled in the art will recognize that the computer system 100 need not include any software development environment at all.

Those skilled in the art will understand that the MATLAB® technical computing environment is a math-oriented, textual programming environment well-suited for digital signal processing (DSP) design, among other uses. The SIMULINK® technical computing environment is a graphical, block-based environment for modeling and simulating dynamic systems, among other uses.

Figure 2:
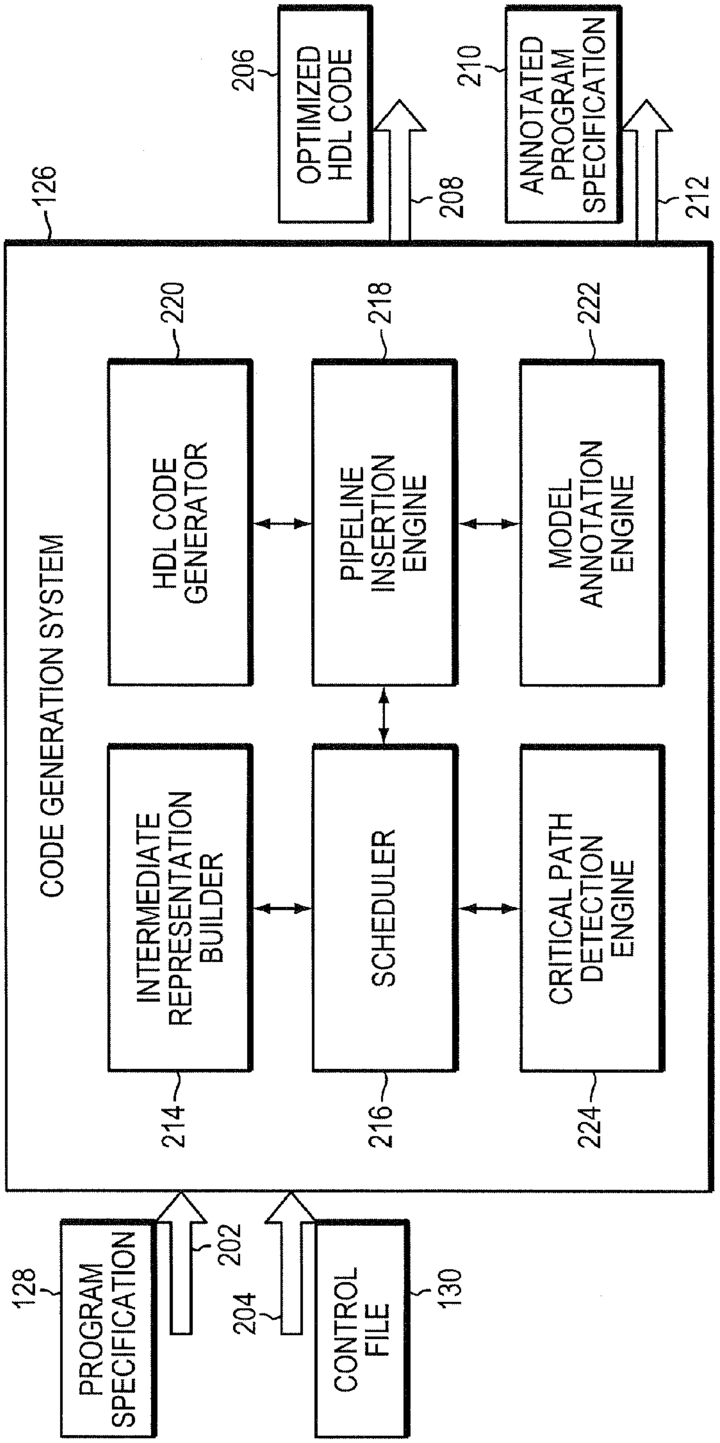
FIG. 2 is a schematic block diagram of a code generation system in accordance with a preferred embodiment of the present invention.

FIG. 2 is a highly schematic block diagram of the code generation system 126. The code generation system 126 may receive the program specification 128 created by the user or developer with the high-level technical computing environment 124, as indicated by arrow 202. The program specification may be a graphical model, such as a Simulink model, a block diagram a Stateflow chart, a high-level textual code listing, such as an M-file, etc. The code generation system 126 may also receive the control file 130 is created by the user or developer, as indicated by arrow 204. As described herein, the code generation system 126 may produce hardware description language (HDL) code 206, such as VHDL or Verilog code, that is optimized, e.g., through the inclusion of one or more pipelines or registers, as indicated by arrow 208. In alternative embodiments, the code generation system 126 may produce SystemC code or code in any number of other languages, including the language of the original program specification. The code generation system 126 may also produce one or more annotated versions of the program specification 210, as indicated by arrow 212.

The code generation system 126 may include a plurality of components or modules. Specifically, the code generation system 126 may include an intermediate representation (IR) builder 214 that is configured to create one or more IRs from the program specification. The code generation system 126 may also include a scheduler 216, a pipeline insertion engine 218, a Hardware Description Language (HDL) code generator 220, a model annotation engine 222, and a critical path detection engine 224.

The IR builder 214, the scheduler 216, the pipeline insertion engine 218, the HDL code generator 220, the model annotation engine 222, and the critical path detection engine 224 may each comprise registers and combinational logic configured and arranged to produce sequential logic circuits. In the illustrated embodiment, the IR builder 214, the scheduler 216, the pipeline insertion engine 218, the HDL code generator 220, the model annotation engine 222, and the critical path detection engine 224 are software modules or libraries containing program instructions pertaining to the methods described herein, that may be stored on computer readable media, such as computer readable medium 130, and executable by one or more processing elements, such as CPU 102. Other computer readable media may also be used to store and execute these program instructions. In alternative embodiments, various combinations of software and hardware, including firmware, may be utilized to implement the present invention.

Figure 3:
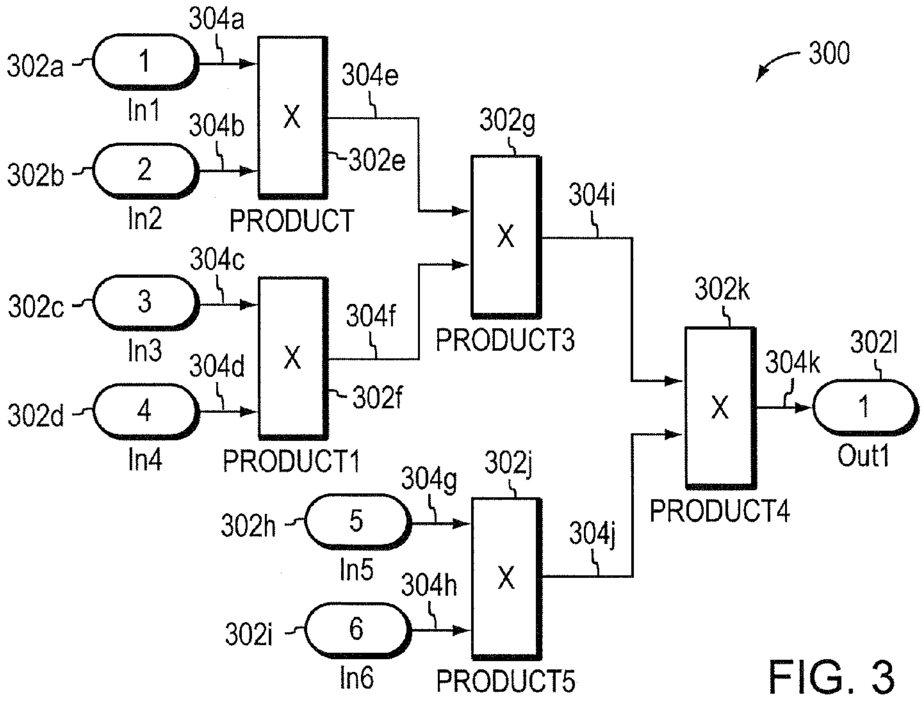
FIG. 3 is an exemplary high-level program specification for use with the present invention.

FIG. 3 is a schematic illustration of a program specification in the form of a graphical model 300. As shown, the graphical model 300 may include a plurality of is blocks 302*a*-1 interconnected by lines 304*a*-*k* that establish mathematical relationships between the blocks. Lines 304*a*-*k* may alternatively or additionally represent signals. Each block 302*a*-1, moreover, may correspond to a functional element, such as a mathematical, logical, statistical or input/output (I/O) operation, filter, programming construct, such as IF-THEN-ELSE, loops, etc. Blocks 302*e*, 302*f*, 302*g*, 302*j* and 302*k*, for example, each represent a multiplication or product function. Blocks 302*a*, 302*b*, 302*h* and 302*i* each represent an input, and block 302*l* represents an output. The graphical model 300 may also include one or more embedded code blocks (not shown). An embedded code block allows a user to incorporate textual code into a graphical model. A suitable example of an embedded code block is an Embedded MATLAB (EML) function block from The MathWorks Inc. The EML function block supports a subset of the functions provided by the MATLAB technical computing environment.

Figure 4A:
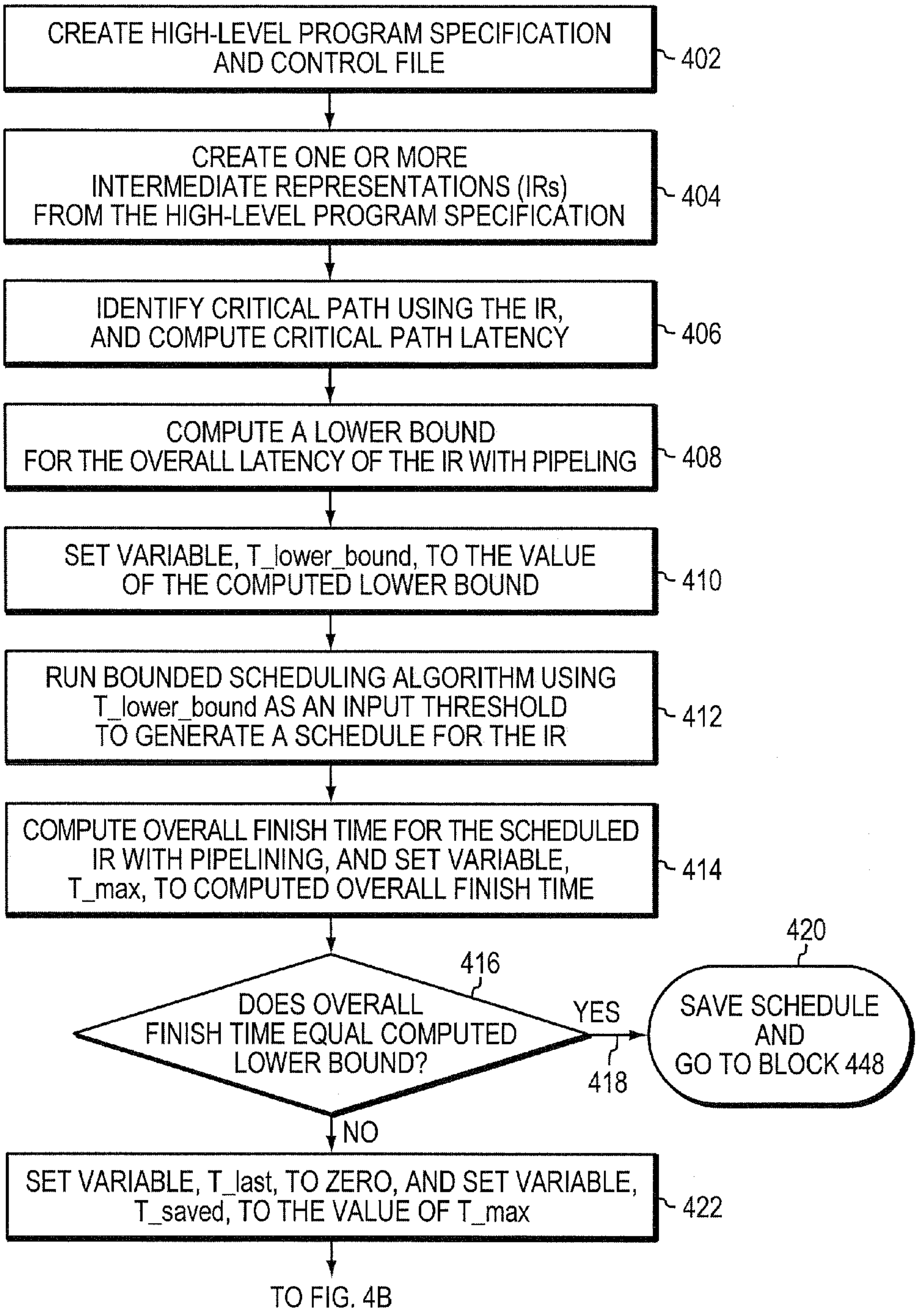
FIGS. 4A, 4B, 6A and 6B are flow diagrams of methods in accordance with preferred embodiments of the present invention.
Figure 4B:
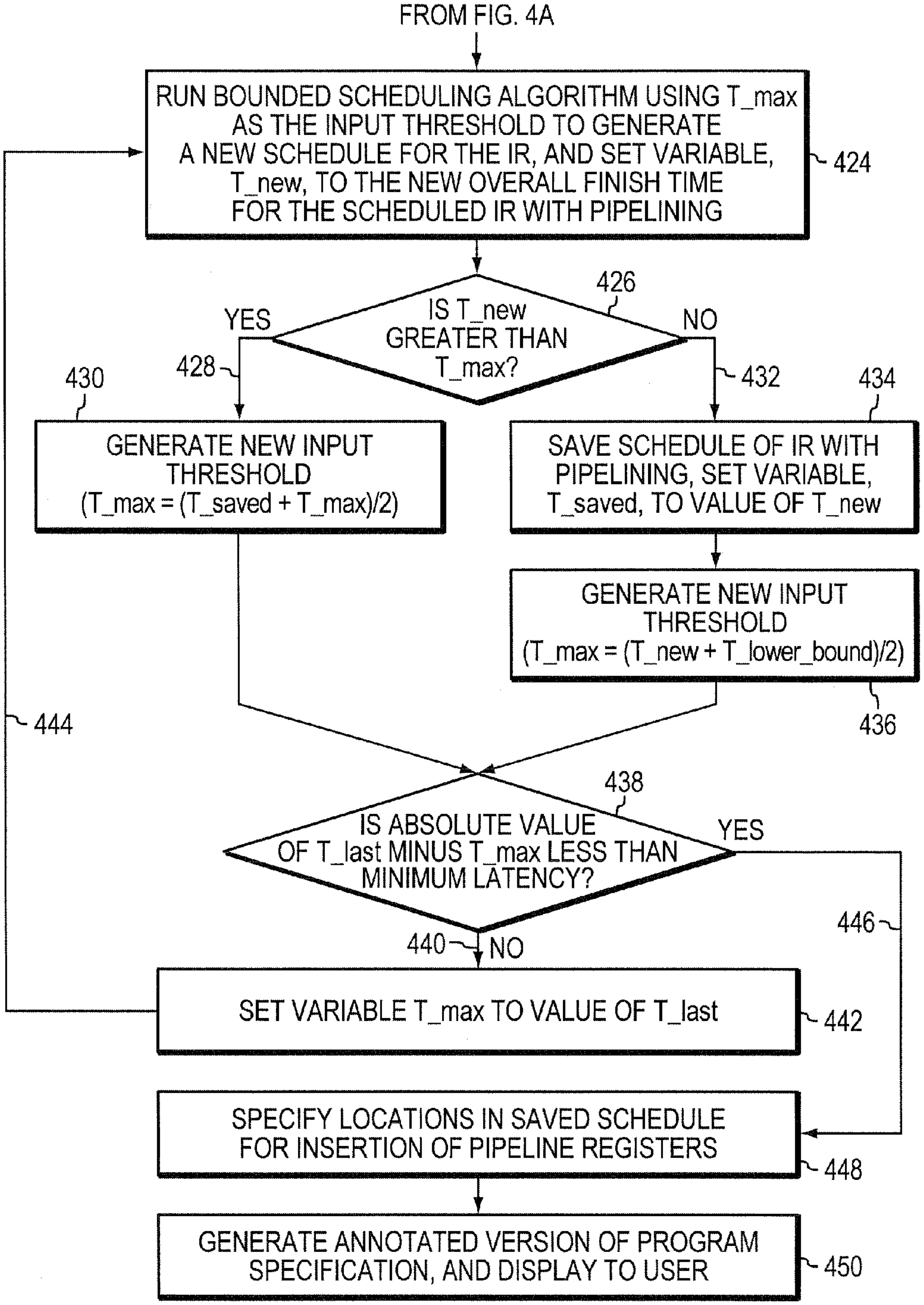

Graphical model 300 is meant for illustrative purposes only. Those skilled in the art will recognize that other, e.g., simpler, more complex, or other models, e.g., having different types or arrangements of blocks, etc., may be created by the developer. For example, in one embodiment, one or more of the graphical blocks may represent a subsystem, which itself comprises a plurality of interconnected blocks and/or subsystems. FIGS. 4A and 4B are a flow diagram of a method in accordance with a preferred embodiment. First, the user may create a program specification, such as graphical model 300, using the high-level technical computing environment 124, as indicated at block 402. The graphical model may be a model in a time-based system and/or an event-based system, such as, for example, a state diagram. Those skilled in the art will understand that the program specification may take other forms besides a graphical model, such as a high-level, math-based textual specification, a single block of a graphical model, a subsystem, etc. In addition to creating the program specification, the user may also create a control file. The control file may include an indication of the number of stages that are to be created in the hardware description language (HDL) code for the graphical model. For example, the control file may include a variable, such as 'OutputPipeline', that the user may set to the desired number of pipeline stages for the generated code. A user may start with two pipeline stages. The user may then try other numbers of pipeline stages, such as three, four, five, etc. In an alternative embodiment, the indication about the desired number of pipeline stages may be provided not through the control file, but through a user interface or as part of the graphical model metadata, etc. In yet other embodiments, the total number of pipeline stages may be selected automatically, based on various considerations, as deemed appropriate by one of skill in the art.

The IR builder 214 may receive the program specification and create one or more intermediate representations (IRs) that are stored in memory, such as main memory 104, as indicated at block 404. In an illustrated embodiment, the IR builder 214 may create a Control Flow Graph (CFG). The CFG has a plurality of nodes that represent the operations of the graphical model. That is, each block of the graphical model may map to one or more nodes of the CFG. The nodes of the CFG are interconnected by arcs that represent the control dependencies among the nodes. The IR builder 214 may then overlay a data flow representation onto the CFG so as to create a Control Data Flow Graph (CDFG).

Figure 5:
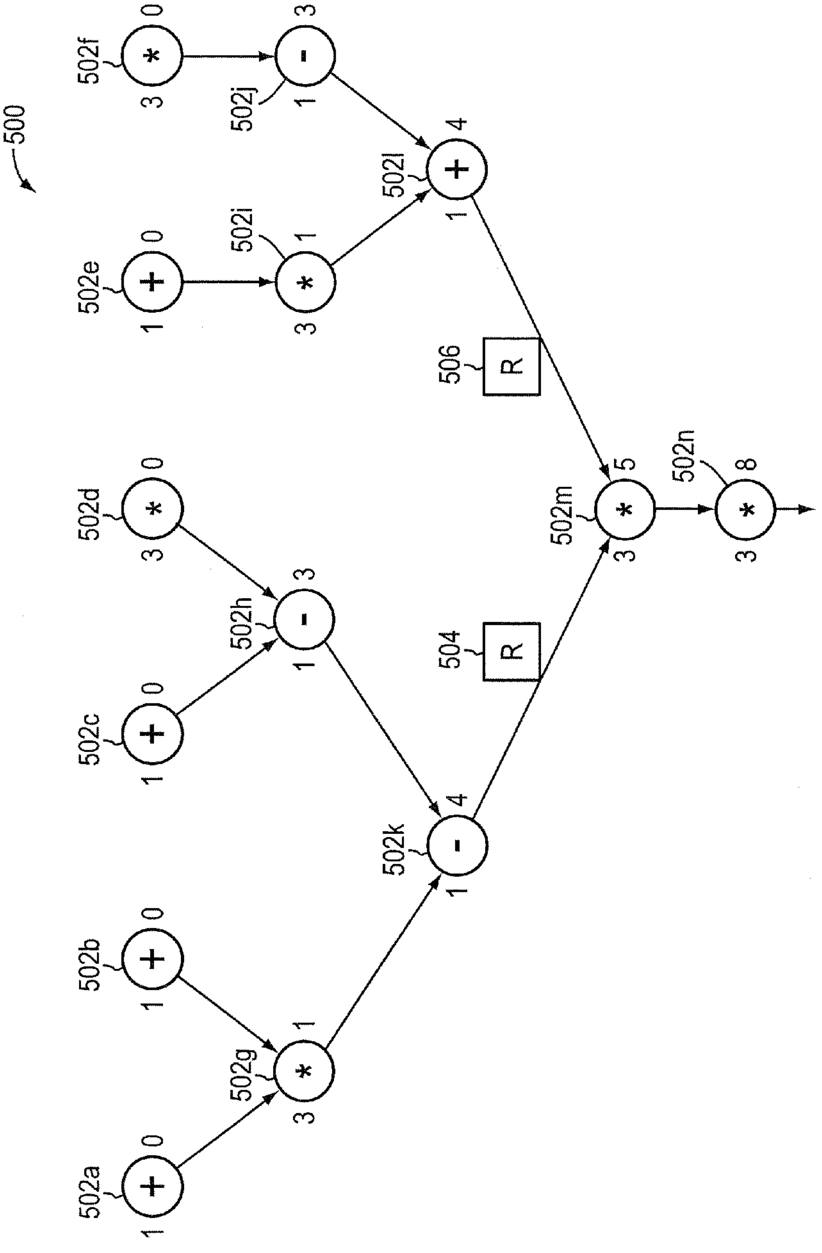
FIG. 5 is a schematic illustration of a control data flow graph.

The CDFG captures the control flow as well as the data flow of the graphical model 300 through its data dependency and the control dependency edges, respectively. FIG. 5 is a highly schematic illustration of a CDFG 500. The CDFG 500 has a plurality of nodes 502*a-n*. Each node 502*a-n* of the CDFG 500 relates to a block or statement of a program specification. It should be understood that CDFG 500 does not correspond to graphical model 300 (FIG. 3). Each node 502*a-n* also has an associated latency that corresponds to the execution time of that node. For example, as illustrated in FIG. 5, nodes 502*a* and 502*k* each have a latency of one, while nodes 502*g*, 502*m* and 502*n* each have a latency of three. The latencies of each node are represented by the numbers to the left of each node, and may reside in data structures stored in memory along with other information regarding the nodes, such as the operation performed by the node, pointers to the node's child and/or parent node(s), etc. The latency of a node, moreover, may vary depending on the hardware characterization of the node. As shown, the latencies may be normalized.

The latencies may be obtained from downstream synthesis tools, and may vary depending on the particular model or vendor of the particular programmable logic device being utilized. The scheduler 216, moreover, may use latencies corresponding to a particular programmable logic device, or it may use assumed latencies, which may be obtained by averaging the latencies associated with some number of different programmable logic devices. In an alternative embodiment, the latencies, as discussed above, used by the scheduler 216 may relate to one or more parameters other than execution time associated with each node. Examples may include area, implementation cost, available resources, etc.

In alternative embodiment, the IR builder 214 may create a CDFG directly from the program specification without first building a CFG. It should also be understood that the IR builder may create one or more other types of IRs, such as a program structure tree (PST), an abstract syntax tree (AST), etc., either in addition to the CFG and/or CDFG or alternatively.

The critical path detection engine 224 may evaluate the CDFG 500, and compute the critical path of the program specification using the CDFG 500, as indicated at block 406. The critical path is the path through the CDFG that has the longest overall latency. To compute the critical path, the critical path detection engine 224 may traverse each path of the CDFG and sum the latencies of the operations on each path. The path having the highest sum is the critical path.

As described herein, the scheduler 216 determines an execution schedule for the nodes 502*a-n* of the CDFG 500 that includes the number of pipeline stages specified by the user, minimizing the overall latency for the program specification. The scheduler 216 may repeatedly, e.g., iteratively, apply a bounded scheduling algorithm to schedule the nodes minimizing the overall latency. From the overall latency, the clock cycle for running a hardware implementation of the program specification may be determined.

Iterative Application of a Bounded Scheduling Algorithm

The scheduler 216 initially computes a lower bound for the overall latency of the CDFG, as indicated at block 408. The scheduler may compute the lower bound by taking the maximum of (i) the critical path latency divided by the number of pipeline stages, specified by the user, and (ii) the latency of the slowest node in the CDFG, e.g., the node that takes the longest time to execute. A variable, such as T_lower_bound, may be set to the value of this computed lower bound, as indicated at block 410. A pipeline stage may relate to a clock cycle, a step, an input/output combination, a logical clock cycle, a sample period, etc.

The scheduler 216 may then apply, e.g., execute, a bounded scheduling algorithm to generate an execution schedule for the nodes of the CDFG using the value of T_lower_bound as an input time bound, e.g., as an input threshold, as indicated at block 412. An exemplary bounded scheduling algorithm is described below in connection with FIGS. 6A-B. An overall finish time, which is the time it takes to finish execution of all of the nodes in the CDFG, as calculated based on the assigned latencies, is then computed, as indicated at block 414. Because the CDFG is being pipelined, the overall finish time corresponds to the pipeline stage with the greatest latency, i.e., the pipeline stage that takes the longest to execute.

The scheduler 216 saves the computed overall finish time with a variable, such as T_max, as also indicated at block 414. That is, the scheduler may set T_max to the value of the computed overall finish time.

The scheduler 216 may determine whether the computed overall finish time is equal to the value of T_lower_bound, as indicated at decision block 416. If so, then the generated execution schedule is an acceptable solution. In this case, the schedule is saved for further processing, as indicated by Yes arrow 418 leading to Go To block 420, described in more detail below.

In certain cases, the computed overall finish time will not equal the value of T_lower_bound. The computed overall finish time from block 414 does, however, represent the upper bound value for the overall finish time. The scheduler 216 may apply a binary search strategy or approach between the upper and lower bounds to solve for an execution schedule minimizing the overall execution time.

Specifically, the scheduler 216 may initialize another variable, e.g., T_last, to zero, as indicated at block 422, and may set another variable, e.g., T_saved to the value of T_max. As indicated at block 424 (FIG. 4B), the scheduler 216 may then re-run the bounded scheduling algorithm with the current value of T_max as the input threshold, namely the overall finish time from when the bounded scheduling algorithm was run with T_lower_bound as the input threshold. This results in a new execution schedule of the nodes of the CDFG and a new overall finish time, which again corresponds to the pipeline stage with the greatest execution latency. The scheduler 216 may set another variable, T_new, to the value of the new overall finish time generated as a result of this running of the bounded scheduling algorithm.

The scheduler 216 may determine whether the value of T_new is greater than the value of T_max, as indicated at decision block 426. If T_new is greater, meaning that the overall execution time is now higher than it was as a result of the last running of the bounded scheduling algorithm, a new T_max value is computed, as indicated by Yes arrow 428 leading to block 430. More specifically, T_max may be set to T_saved minus T_max divided by two. Obviously, the first T_new will be less than T_max as it was generated by setting the input threshold to the upper bound. If T_new is less than T_max, then the current execution schedule may be an optimal schedule. In this case, the scheduling solution is saved, as indicated by No arrow 432 leading to block 434. The variable T_saved is then set to the value of T_new, as also indicated at block 434, and a new value of T_max may be computed in case the solution is not optimal and another running of the bounded scheduling algorithm is performed, as indicated at block 436. Specifically, the value of T_max is set to the value of T_new plus T_lower_bound divided by two.

Blocks 430 and 436 then converge at decision block 438 where the scheduler 216 determines whether an optimal solution has been obtained. To determine whether the current solution is an optimal solution, the scheduler may determine whether the absolute value of T_last minus T_max is less than a minimum latency. The minimum latency may be set to the value of the greatest common divisor of the latencies of all of the nodes of is the CDFG. As indicated above, moreover, the latencies of the nodes may be normalized, and therefore the greatest common divisor may be one. If it is, then an optimal solution has been obtained. In this case, the saved schedule is passed to the pipeline insertion engine 218 for further processing as described in more detail below.

If not, the scheduler 216 sets the value of variable T_max to the value of variable T_last, as indicated by No arrow 440 leading to block 442. Processing then returns to block 424, as indicated by return arrow 444. As indicated, steps 424-442 are repeated, i.e., the bounded scheduling algorithm is iteratively applied, until a solution is achieved minimizing the overall execution time of the CDFG, as determined by decision block 438.

Bounded Scheduling Algorithm

Figure 6A:
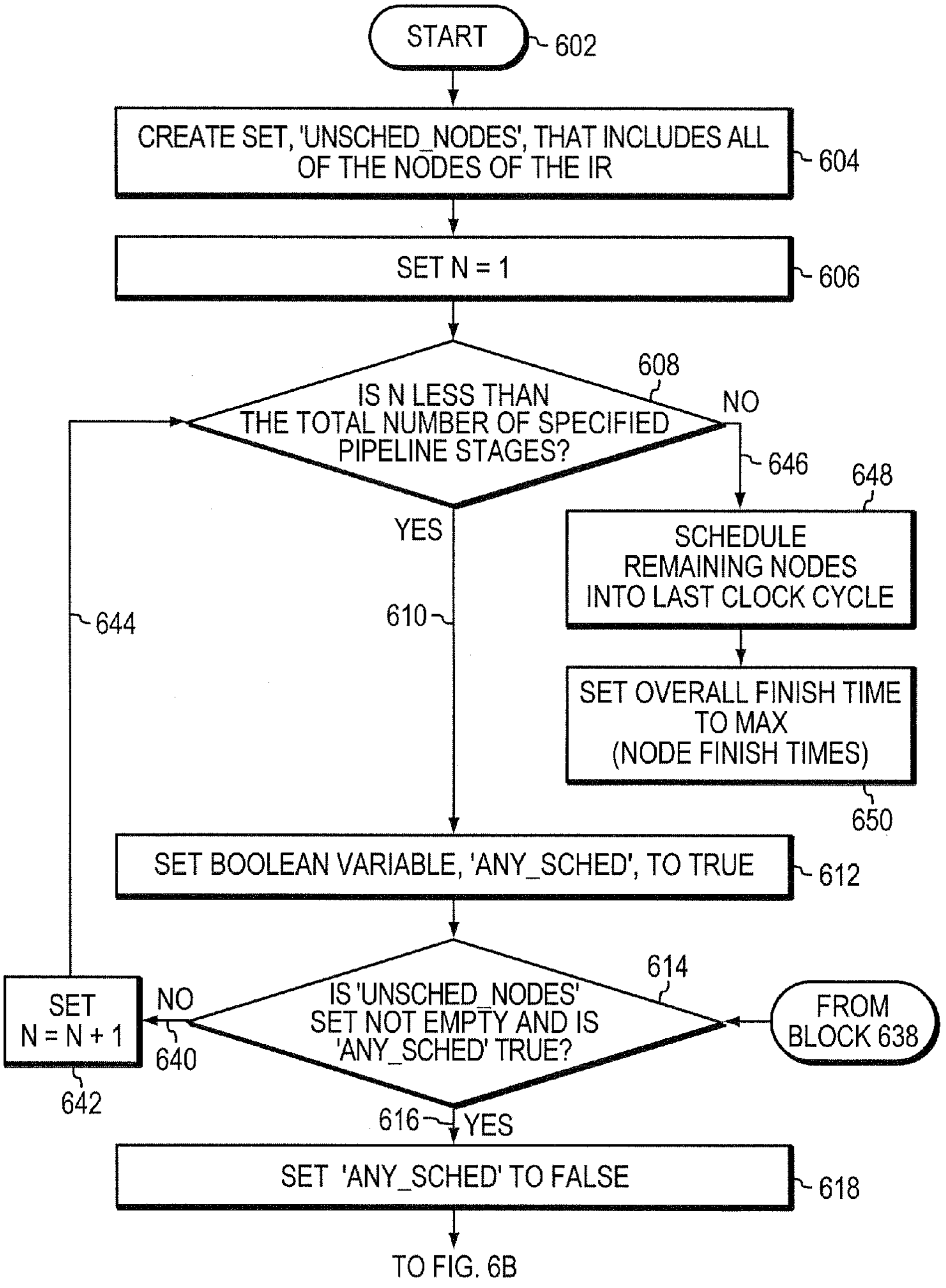
Figure 6B:
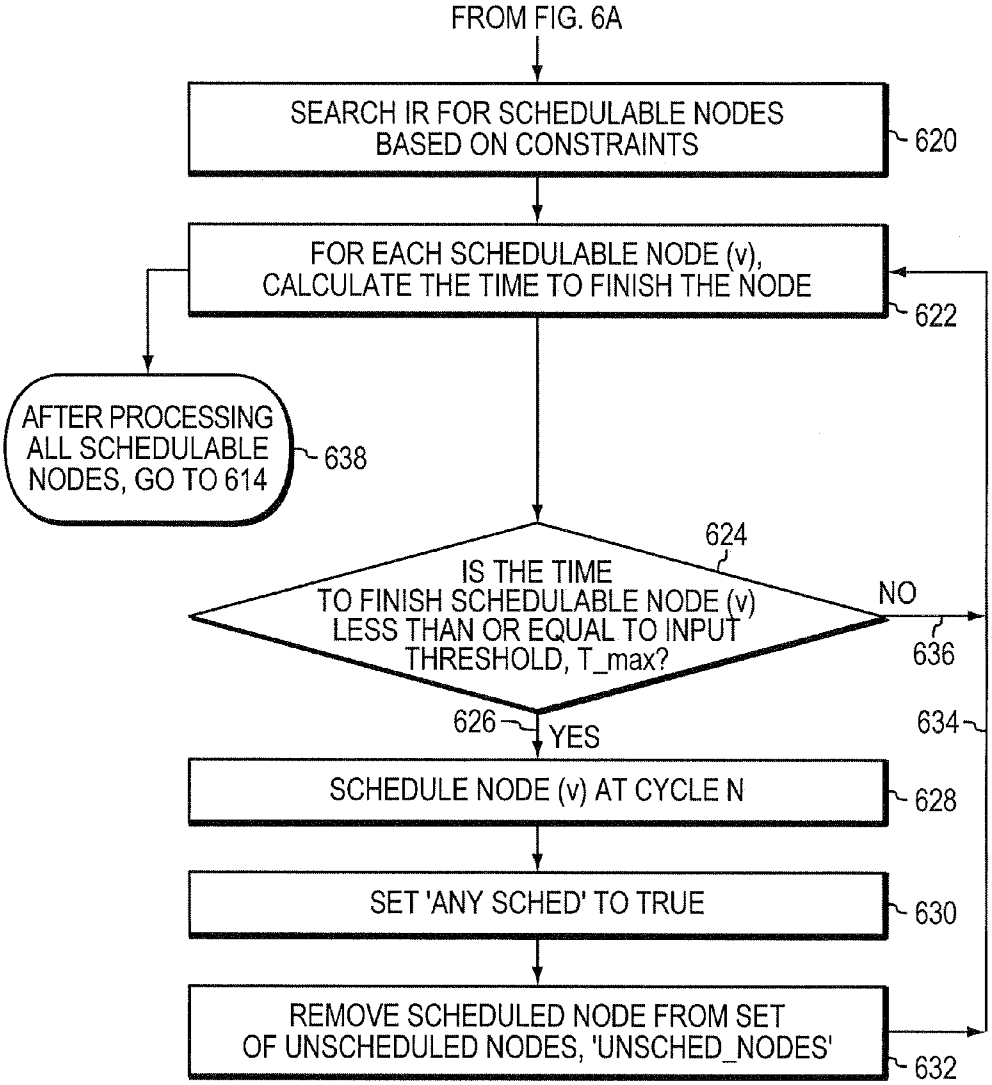

FIGS. 6A-B are a flow diagram of a preferred method for a bounded scheduling algorithm. Processing may begin at a start block 602. The scheduler 216 may create a set called 'UNSCHED_NODES' that includes all of the nodes/operations of the IR, i.e., CDFG 500 (FIG. 5), as indicated at block 604. The scheduler 216 may also set a variable, e.g., N, which corresponds to the clock cycle number, to one, as indicated at block 606.

The scheduler 216 may then evaluate whether N is less than the total number of pipeline stages, as indicated at decision block 608. In one embodiment, the scheduler may receive the total number of number of pipeline stages, e.g., two, three, four, etc, from the control file created by the user. Since the case of one pipeline stage may not require any further analysis, the minimum number of pipeline stages is two. Rather than specify pipeline stages, the user (or system) could specify the number of pipeline boundaries to be created, where one pipeline boundary results in two pipeline stages, two pipeline boundaries results in three pipeline stages, and so on. If the user specifies two pipeline stages (or one pipeline boundary), then the CDFG will execute in two stages, for example, two clock cycles. If the user specifies three pipeline stages (or two pipeline boundaries), then the CDFG will execute in three stages, for example, three clock cycles, and so on. In this example, the number of clock cycles equals the number of pipeline stages (or the number of pipeline boundaries plus one).

In an alternative embodiment, the scheduler 216 may be configured to examine, e.g., process, one or more pipeline stage values without any input from the user. With this embodiment, the code generation system 126 may select an optimized number of pipeline stages after having evaluated several alternatives.

At decision block 608, the scheduler 216 is essentially determining whether or not N is currently set to the last clock cycle. If N is less than the total number of pipeline stages, then the scheduler 216 is scheduling nodes into something other than the last clock cycle. As described, N is initialized to one corresponding to the first clock cycle. As described below, N is subsequently incremented through each clock cycle, e.g., two, three, etc., all the way to the last clock cycle.

If N is currently less than the total number of pipeline stages, then the scheduler 216 sets a Boolean variable, e.g., 'ANY_SCHED', to True, as indicated by Yes arrow 610 leading to block 612. Processing then flows to decision block 614 where the scheduler determines whether the 'UNSCHED_NODES' set is not empty, and whether the 'ANY_SCHED' Boolean variable is true. If both conditions are true, the scheduler 216 sets the 'ANY_SCHED' Boolean variable to false, as indicated by Yes arrow 616 leading to block 618. The scheduler 216 may then search the IR, e.g. CDFG 500, for all nodes that are capable of being scheduled, as indicated at block 620 (FIG. 6B). The determination of which nodes are capable of being scheduled depends on the particular scheduling algorithm and constraints, if any, being applied. The scheduler 216 may be configured to apply the As Soon As Possible (ASAP) scheduling algorithm. Constraints may include data dependencies, resource constraints, such as number of available multipliers on the target hardware, etc. In accordance with the ASAP algorithm, the scheduler 216 looks for nodes whose execution either does not depend upon the execution of any other node, or only depends on the execution of nodes that have already been scheduled. As no nodes have yet been scheduled, the scheduler 216 searches for those nodes of the IR whose execution does not depend upon any other nodes. All such nodes are considered capable of being scheduled at this point in the processing.

Similarly, if all of the available resources, such as multipliers, are being used in the current clock cycle, then another multiplication operation cannot be scheduled in the current clock cycle. Instead, it must be scheduled in a different clock cycle.

It should be understood that the scheduler 216 may use other scheduling algorithms, such as the As Late As Possible (ALAP) scheduling algorithm, the List scheduling algorithm, the Force Directed scheduling algorithm, or the integer linear programming (ILP) scheduling algorithm, etc For each such node, v, that is capable of being scheduled, the scheduler 216 calculates the finish time, T_v_finish, for that node, as indicated at block 622. The finish time of a given node may be determined as follows. If the given node has one or more parent nodes, then the finish time is the greatest finish time for all of the given node's parent nodes plus the execution latency of the given node. If the given node is the first node on its path to be scheduled in the current clock cycle, then the finish time is simply the execution latency of the given node. If the given node has two parent nodes whose finish times are three and four, then the finish time of the given node is four plus the execution latency of the given node.

The scheduler 216 then determines whether the finish time of the given node is less than or equal to the input threshold, e.g., T_max, as indicated at decision block 624. If it is, then the given node may be scheduled in the current clock cycle, as indicated by "Yes" arrow 626 leading to block 628. Now that a node has been scheduled, the scheduler may set the Boolean variable 'ANY_SCHED' to true, as indicated at block 630. The scheduler may also remove the given node from 'UNSCHED_NODES,' which as described above is the set of unscheduled nodes, as indicated at block 632. Processing then returns to block 622, as indicated by return arrow 634, where the scheduler 216 tries to schedule the next schedulable node into the current clock cycle. This process continues until all of the schedulable nodes whose finish time is less than or equal to the input threshold, T_max, have been scheduled into the current clock cycle. As shown, if the finish time of a given schedulable node is greater than the input threshold, then the given node is not scheduled at the current clock cycle, and the 'ANY_SCHED' Boolean variable is not set to true (at least in response to the given node), as indicated by the "No" arrow 636.

After evaluating the finish time of all schedulable nodes, and scheduling those nodes whose finish time is less than or equal to the input threshold into the current clock cycle, processing may return to decision block 614 (FIG. 6A), as indicated by the Go To block 638. Again, the scheduler 216 determines whether the 'UNSCHED_NODES' set is not empty, and whether the 'ANY_SCHED' Boolean variable is true. If both conditions are met, another pass through blocks 618-632 is performed. That is, the 'ANY_SCHED' Boolean variable is set to false, and the IR is searched for any schedulable nodes. Because one or more nodes were scheduled during the prior pass through blocks 618-638, this search will likely reveal new nodes that may now be scheduled.

Referring to FIG. 5, suppose the input threshold is 4.5. The first time through blocks 614-638, the schedulable nodes include nodes 502*a-f*, as these nodes do not have any parent nodes and thus do not depend on the execution of any other nodes. As the input threshold is 4.5 and the maximum latency of nodes 502*a-f* is 3, each of these nodes is scheduled in the first clock cycle. Processing then returns to decision block 614, which is met. Accordingly, the 'ANY_SCHED' Boolean variable is set to false and the IR is again searched for schedulable nodes. Because nodes 502*a-f* have already been scheduled, the schedulable nodes now include nodes 502*g-j*. Regarding node 502*g*, the computed finish time is 4, i.e., 1 plus 3. As this finish time is less than or equal to the input threshold, node 502*g* is also scheduled for execution in the first clock cycle. Nodes 502*h-j* may also be scheduled in the first clock cycle, along with parent nodes 502*a-f*. Again, processing returns to decision block 614. This time, the schedulable nodes include nodes 502*k* and 502*l*. However, as the finish time for both of these nodes is 5, neither one is scheduled in the first clock cycle. Accordingly, in this pass through blocks 614-638, no nodes were scheduled and thus the 'ANY_SCHED' Boolean variable remains set to false. Therefore, the response to decision block 616 is no, because both conditions are not met.

That is, although the set of unscheduled nodes, 'UNSCHED-NODES', is not empty, the 'ANY_SCHED' Boolean is false, as no nodes were scheduled during this last pass through blocks 614-618. In this case, the scheduler 216 increments N by one, as indicated by No arrow 640, leading to block 642. Processing may then return to decision block 608, as indicated by return arrow 644, where a determination is made whether N is set to the last clock cycle.

The process of scheduling nodes into each of the clock cycles from N to N-1 continues as described above. When N is finally incremented to the value of the last clock cycle, the scheduler 216 proceeds to schedule all of the remaining, i.e., unscheduled, nodes into the last clock cycle, as indicated by No arrow 646 leading to block 648. The scheduler also computes the finish time for each of these nodes being scheduled into the last clock cycle. The scheduler also sets the overall finish time for this particular execution schedule of the IR to the maximum finish time of all of the nodes, as indicated at block 650. In other words, in addition to having produced an execution schedule for the IR, the scheduler 216 has also determined an overall finish time for this execution schedule.

It should be understood that the finish time for one or more of the nodes scheduled into the last clock cycle may well exceed the input threshold, e.g., T_max.

As one skilled in the art will appreciate, the CDFG may include branches and/or conditional regions. In a first embodiment, the bounded scheduling algorithm may be configured to only insert registers either at the entry or at the exit of such conditional regions, but not within the regions themselves. In another embodiment, a predication may be applied to convert the conditional regions into data flow regions, thereby increasing the scope of pipelining.

Once the scheduler 216 has created a schedule minimizing the overall execution time, either by generating a schedule in which the overall execution time equals the lower bound, or the absolute value of the difference between the last two computed overall execution times is less than a minimum latency, the scheduler 216 may provide the optimized schedule to the pipeline insertion engine 218. The pipeline insertion engine 218, in turn, may specify each location where a pipeline register is to be inserted in the, now scheduled, IR, as indicated by Go To block 420 (FIG. 4A) and by Yes arrow 446 (FIG. 4B) leading to block 448. Specifically, the pipeline insertion engine 218 may indicate in the schedule that a pipeline register is to be inserted at each point along each path in the IR that crosses a clock cycle boundary. That is, for each path in the IR, a pipeline register is inserted between each pair of nodes scheduled to execute in different clock cycles. With reference to FIG. 5, and the above example where T_max is 4.5, these locations are shown at markers 504 and 506. Each pipeline register temporarily stores data and/or instructions between clock cycles.

The HDL code generator 220 may take the saved schedule as marked with the location of pipeline registers and generate optimized HDL code 206, such as VHDL or Verilog code, as indicated by arrow 208 (FIG. 2). This generated HDL code includes one or more statements or entries for each of the inserted pipeline registers. This optimized HDL code 206 may be converted into a serial bit stream for synthesizing target hardware, such as an FPGA, ASIC, CPLD, or other programmable logic device.

Suitable synthesis and layout tools include the ModelSim simulation and debug environment from Mentor Graphics Corp of Wilsonville, Oreg., and the Synplify family of synthesis tools from Synplicity, Inc. of Sunnyvale, Calif.

In a further embodiment, the scheduler may be configured to create a schedule minimizing the overall execution time for a plurality of pipeline stages automatically, and then present the user with the number of pipeline stages producing the lowest overall execution time. That is, the scheduler may be configured to create a first schedule minimizing the overall execution time with two pipeline stages, a second schedule with three pipeline stages, a third schedule with four pipeline stages, and so on. The scheduler may further determine an optimum number of pipeline stages, e.g., based on the highest throughput.

Model Annotation

In a further embodiment, the model annotation engine 222 may generate annotations to the program specification, for example as an annotated version of the program is specification 210, and display this annotated version to the user, as indicated at block 450 (FIG. 4A) and arrow 212 (FIG. 2), e.g., on screen 120. Specifically, the model annotation engine 222 may add a new icon or graphical widget to the displayed program specification for each inserted pipeline register to indicate to the user where the code generation system 126 has inserted pipeline registers. The annotation may be stored and/or represented separately from the program specification.

Figure 7:
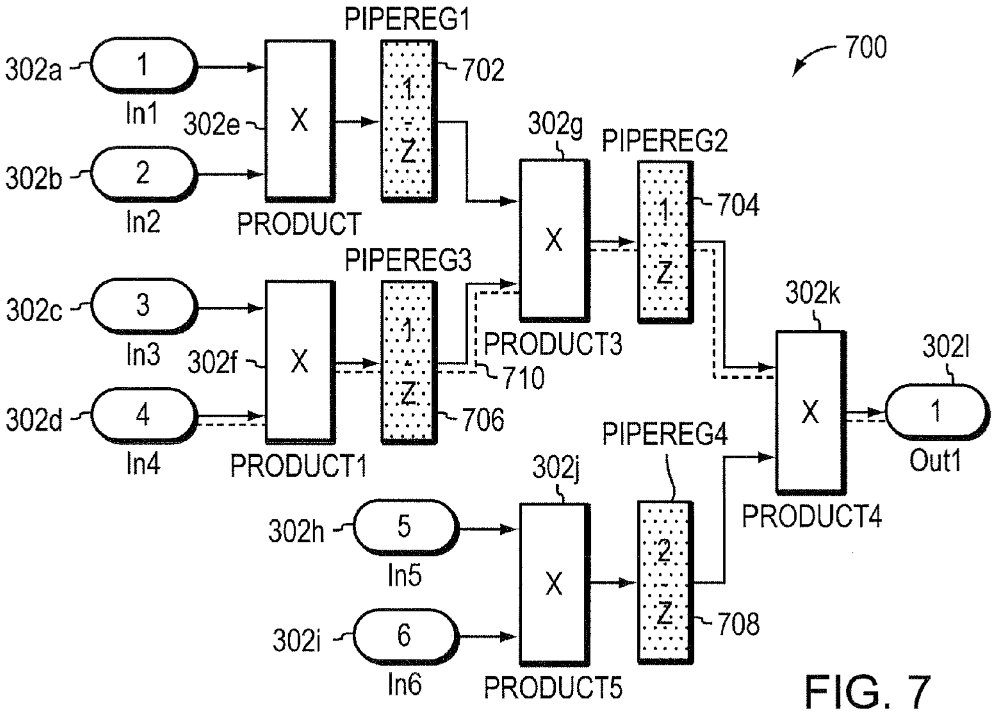
FIG. 7 is a schematic illustration of an annotated version of the program specification of FIG. 3.

FIG. 7 is a schematic illustration of an annotated version 700 of the program specification that is a graphical model 300 of FIG. 3. The annotated model 700 includes each of the blocks 302*a*-1 in the original graphical model 300. In addition, the annotated model 700 includes an indication, such as an icon, block, etc., for each of the pipeline registers inserted by the pipeline insertion engine 218. Specifically, in response to the insertion of a pipeline register between nodes 302*e* and 302*g*, a register icon 702 is added and displayed in the annotated model 700. A second register icon 704 is added and displayed between nodes 302*e* and 302*g*. A third register icon 706 is added and displayed between nodes 302*f* and 302*g*. A fourth register icon 708 is added and displayed between nodes 302*j* and 302*k*.

By displaying an annotated version of the program specification, such as annotated model 700, to the user, the user can quickly evaluate where the code generation system 126 proposes to add pipeline registers. In response, the user can accept the inserted pipeline registers, and direct code such as HDL code to be generated that includes statements or entries for the pipeline registers. Alternatively, the user can conduct additional design space exploration, such as by refining or otherwise modifying the program specification, e.g., graphical model 300, e.g., by adding or removing one or more blocks, and direct the code generation system 126 to evaluate this new graphical model and propose the insertion of pipeline registers. Furthermore, the user can change the number of pipeline stages for the program specification.

In a further embodiment, the critical path detection engine 222 is also configured to compute the critical path of the program specification, e.g., graphical model 300, using the IR, and mark the critical path for display to the user. More specifically, the critical path detection engine 222 may use the latencies of the nodes of the IR to determine which path through the IR has the greatest latency. The critical path detection engine may then select the corresponding path of the program specification for display to the user. For example, as shown in FIG. 7, the model annotation engine 222 may place a dashed line 710 next to the critical path through the annotated model 700. Those skilled in the art will understand that the critical path may be displayed to the user in other ways, such as by changing the color of the path that represents the critical path as compared to the color of the other paths through the graphical model, highlight the path, lowlight paths other than the critical path, highlight or gray out blocks that are on the critical path or not, respectively, etc.

In response, the user may further explore the design space represented by the program specification by refining or otherwise modifying the program specification to reduce the length of the critical path, among other things.

FIG. 8 is a textual program specification 800 written in the MATLAB programming environment. As shown, the program specification 800 defines an algorithm for calculating a variable, i.e., "out", based on a series of input parameters, i.e., c1 and in1 through in8, and a series of variables, i.e., t1 through t5. If the input parameter c1 is true, then "out" is t3*t4. Otherwise, "out" is t3*t5. As described above, an intermediate representation, such as a Control Data Flow Graph (CDFG), is created from the textual program specification 800. Furthermore, a bounded scheduling algorithm is iteratively applied to generate an execution schedule minimizing overall execution time for a given number of pipeline stages.

Figure 10:
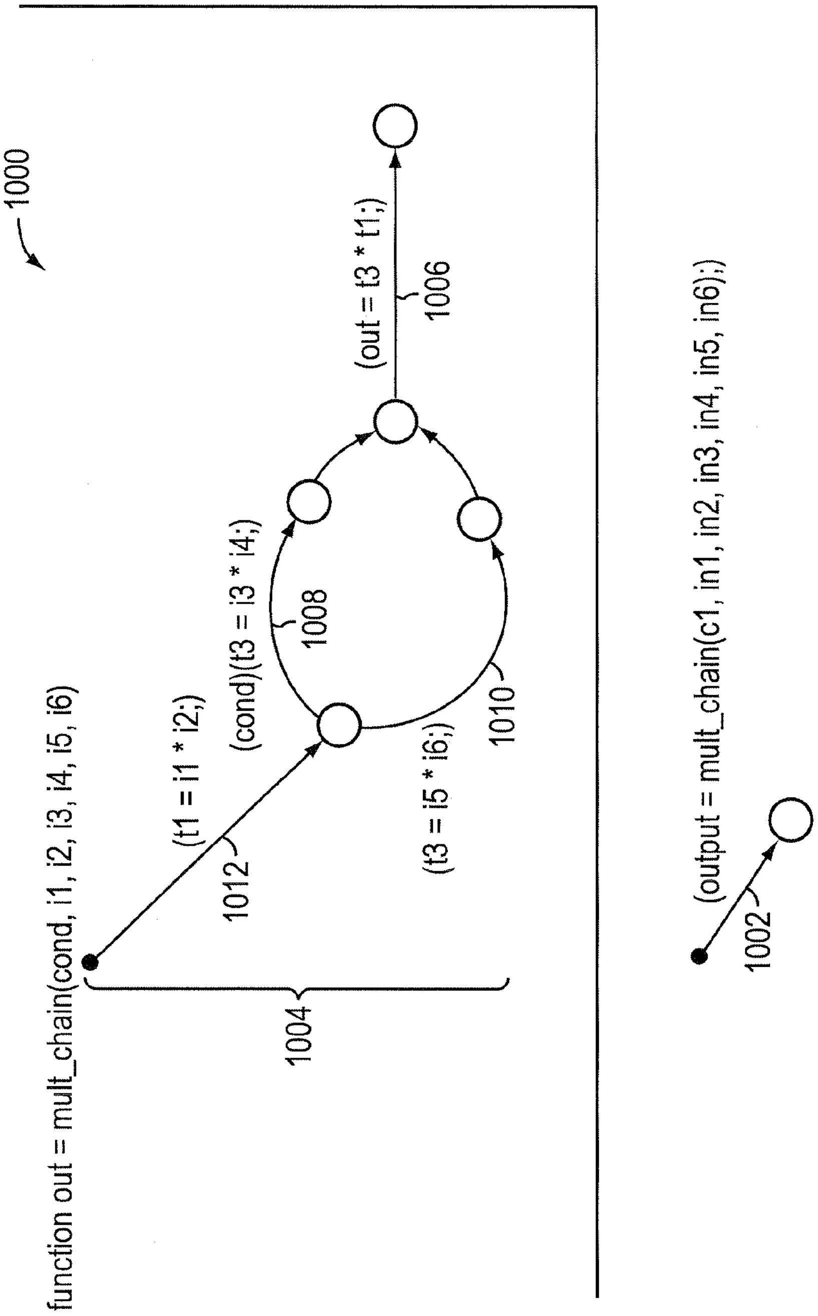

Suppose that the selected number of pipeline stages is three. FIG. 9 is an annotated version 900 of the textual program specification 800 of FIG. 8 illustrating the automatic insertion of pipeline registers so as to organize the program specification into three pipeline stages in accordance with the illustrative embodiment of the present invention. As shown at lines 902-908, seven pipeline registers are defined between the three pipeline stages (0, 1, and 2). Each pipeline register, moreover, is illustrated as a persistent variable. In a first portion 909 of the annotated version 900, the registers are initialized to zero. As shown at lines 910-912, the contents of these registers are used during the calculation of the variable "out". In another portion 914 of the annotated version 900, the contents of the registers are updated for the next evaluation. As discussed above, upon reviewing the annotated version 900, the user may choose to explore the design space represented by the procedure for calculating the variable "out". For example, the user may choose to modify or refine the procedure. FIG. 10 is a graphical program specification 1000 written in the Stateflow programming environment. As indicated at edge 1002, a function call, i.e., "mult_chain", has a series of inputs, i.e., c1 and in1 through in6. Within portion 1004, the variable "out" is calculated by an operation on the variable "t3", as indicated at edge 1006. The value of t3, moreover, depends on a specified condition (cond). Specifically, as indicated at edge 1008, if the condition "cond" is true, then t3 is computed as i3*i4. As indicated at edge 1010, if the condition "cond" is false, then t3 is computed as i5*i6. At edge 1012, t1 is computed as i1*i2.

Again, an intermediate representation, such as a CDFG, may be created from the graphical program specification 1000, and a bounded scheduling algorithm may be iteratively applied to generate an execution schedule minimizing overall execution time for a given number of pipeline stages.

Figure 11:
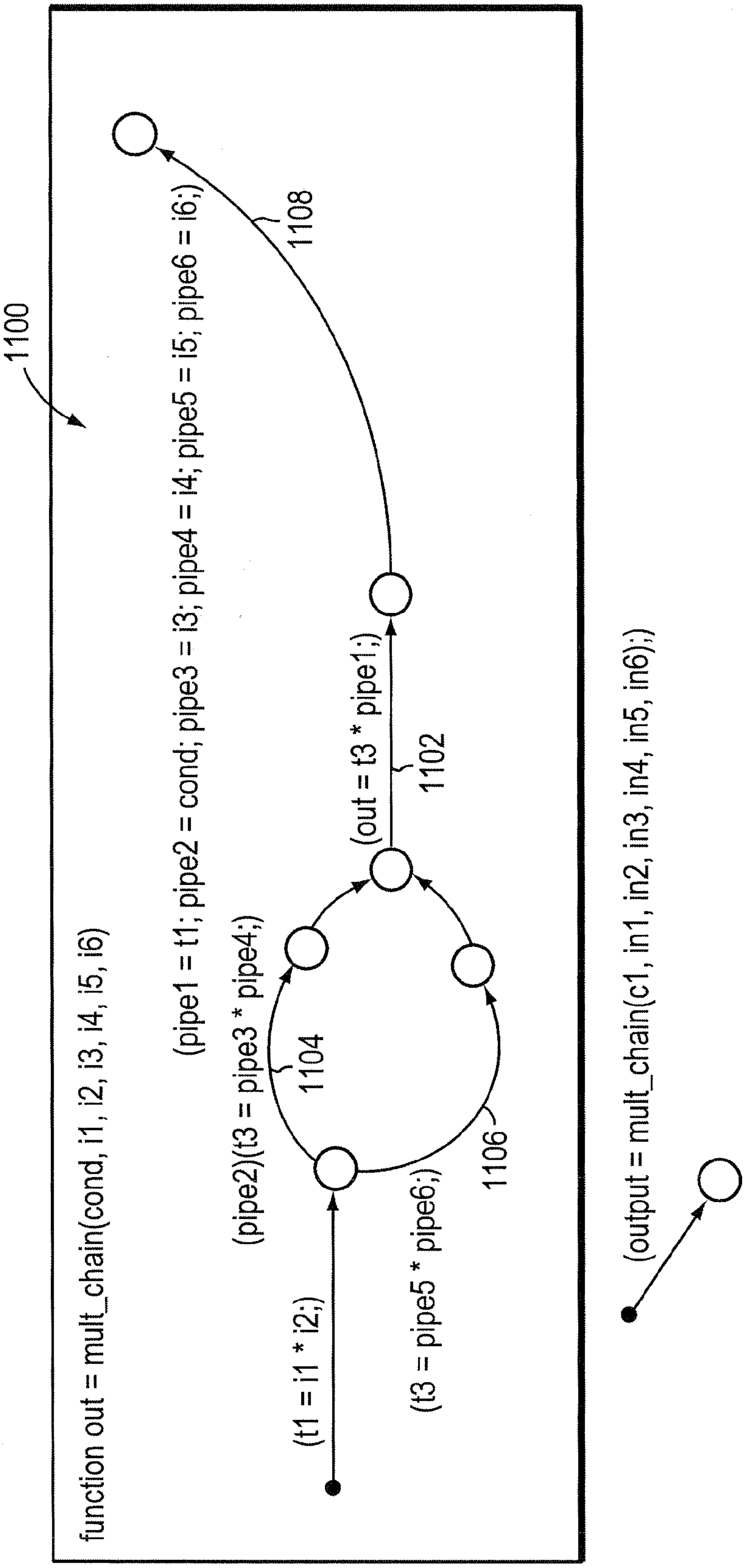

Suppose that the given number of pipeline stages is two. FIG. 11 is an annotated version 1100 of the graphical specification 1000 of FIG. 10 illustrating the insertion of pipeline registers so as to organize the program specification into two pipeline stages in accordance with the illustrative embodiment of the present invention. As indicated, six pipeline registers, pipe1 through pipe6 have been automatically inserted. As indicated at edge 1102, the variable "out" is computed by multiplying the value of variable t3 by the contents of pipeline register pipe1. As indicated at edge 1104, if the condition is true, the variable t3 is computed by multiplying the contents of pipeline register pipe3 by the contents of pipeline register pipe4. As indicated at edge 1106, if the condition is false, the variable t3 is computed by multiplying the contents of pipeline register pipe5 by the contents of pipeline register pipe6. At edge 1108, the contents of the registers pipe1 through pipe6 are updated for the next execution cycle.

The contents of the registers may be initialized for the clock cycles before the actual data reaches them. The initialization values may be set to zero, or they may be user-specified, or otherwise provided, as determined by one of skill in the art.

As described herein, the present invention automatically pipelines a high-level input program specification, such as a graphical Simulink model or Stateflow chart, or a math-based textual program, such as a MATLAB M-file, which are to be distinguished from low-level program specifications, such as VHDL and Verilog.

Alternative embodiments may use similar techniques to split a program for execution on multi-core processors or to create a multi-threaded process or program from a single-threaded process or program.

The foregoing description has been directed to specific embodiments of the present invention. It will be apparent, however, that other variations and modifications may be made to the described embodiments, with the attainment of some or all of their advantages. Therefore, it is the object of the appended claims to cover all such variations and modifications as come within the true spirit and scope of the invention.

What is claimed is:

1. A method for automatically assigning placement for one or more pipeline registers within hardware description language (HDL) code generated from a program specification such that the HDL code for the program specification executes over a plurality of pipeline stages, the method comprising:

building at least one intermediate representation (IR) of the program specification, the at least one IR having a plurality of interconnected nodes that define a plurality of paths through the at least one IR, each node having an execution latency;

storing the IR in a memory;

scheduling an execution order of the nodes of the at least one IR, wherein one or more nodes of the at least one IR are scheduled to execute in a given pipeline stage, the scheduling including repeatedly applying a scheduling algorithm bounded by an input time threshold producing a final scheduled execution order of the nodes of the at least one IR;

specifying one or more pipeline registers for insertion along one or more paths of the at least one IR between pipeline stages;

providing the final scheduled execution order and the specification of pipeline register insertions; and generating the HDL code based on the final scheduled execution order and the specification of pipeline register insertions, the generated HDL code indicating the inserted pipeline registers.

2. The method of claim 1 wherein the generated HDL code is either VHDL code or Verilog code.

3. The method of claim 1 further comprising:

determining a minimum pipeline stage execution latency;

setting the input time threshold of the scheduling algorithm to the minimum pipeline stage execution latency to produce a first schedule having an overall execution time;

determining whether the overall execution time matches the minimum pipeline stage execution latency; and utilizing the first schedule as the final schedule provided that the overall execution time matches the minimum pipeline stage execution latency.

4. The method of claim 1 wherein the repeatedly applying comprises:

determining a lower bound pipeline stage execution latency;

determining an upper bound pipeline stage execution latency; and searching between the lower and upper bound pipeline stage execution latencies for a pipeline stage execution latency that results in the final scheduled execution order.

5. The method of claim 1 wherein the program specification is one or a combination of: a graphical time-based model, a graphical event-based model, a graphical state flow chart, or a high-level, math-based, textual specification.

6. The method of claim 1 further comprising;

generating an annotated version of the program specification that indicates where each pipeline register is inserted.

7. The method of claim 1 wherein the program specification is a graphical model having a plurality of interconnected blocks, the method further comprising:

generating an annotated version of the graphical model having a block representing each of the inserted pipeline registers; and displaying the annotated version of the graphical model to a user.

8. The method of claim 7 wherein the graphical model has a critical path, and the method further comprising:

detecting the critical path through the model using the one or more IRs; and marking the critical path for display to the user.

9. The method of claim 1 wherein the at least one IR is a data flow graph, a control flow graph, or a data control flow graph.

10. The method of claim 1 wherein the scheduling algorithm operates in accordance with an As Soon As Possible (ASAP) scheduling algorithm, an As Late As Possible (ALAP) scheduling algorithm, a List scheduling algorithm, a Force Directed scheduling algorithm, or an integer linear programming (ILP) scheduling algorithm.

11. A computer readable medium comprising instructions executable by a computer, the medium comprising:

instructions to build an intermediate representation (IR) of a program specification, the IR having a plurality of interconnected nodes that define a plurality of paths through the at least one IR, each node having an execution latency;

instructions to store the IR in a memory;

instructions to schedule an execution order of the nodes of the IR, wherein one or more nodes of the at least one IR are scheduled to execute in one of a plurality of pipeline stages, wherein the instructions to schedule include instructions to apply a scheduling algorithm bounded by a threshold resulting in a final scheduled execution order of the nodes of the at least one IR;

instructions to specify locations for insertion of one or more pipeline registers along one or more paths of the IR between pipeline stages;

instructions to provide the final scheduled execution order and the specified locations for insertion of the one or more pipeline registers; and instructions to generate Hardware Definition Language (HDL) code based on the final scheduled execution order, wherein the generated HDL code includes pipeline registers at the specified locations.

12. The non-transitory computer readable medium of claim 11 wherein the threshold is an input time threshold.

13. The non-transitory computer readable medium of claim 12 further comprising:

instructions to compute a minimum latency per pipeline stage; and instructions to initially set the input time threshold of the scheduling algorithm to the computed minimum latency per pipeline stage.

14. The non-transitory computer readable medium of claim 12 wherein the scheduling algorithm operates in accordance with an As Soon As Possible (ASAP) scheduling algorithm, an As Late As Possible (ALAP) scheduling algorithm, a List scheduling algorithm, a Force Directed scheduling algorithm, or an integer linear programming (ILP) scheduling algorithm.

15. An apparatus comprising:

a memory;

means for storing in the memory at least one intermediate representation (IR) of a user-created, high-level program specification, the IR having a plurality of interconnected nodes that define a plurality of paths through the IR, each node having an execution latency means for receiving a specified number of pipeline stages for the user-created, high-level program specification;

means for scheduling an optimized execution order of the nodes of the IR across the specified number of pipeline stages, wherein each node is scheduled to execute in one of the pipeline stages, by minimizing an overall execution time of the pipeline stages;

means for specifying a location for inserting one or more pipeline registers along one or more paths of the IR between pipeline stages;

means for providing the scheduled, optimized execution order and the locations of pipeline register insertions; and means for generating Hardware Description Language (HDL) code from the scheduled, optimized execution order, the generated HDL code indicating a pipeline register at the locations.

16. The apparatus of claim 15 wherein the number of pipeline stages is user specified.

17. The apparatus of claim 15 wherein the scheduling means includes:

means for determining a lower bound pipeline stage execution latency;

means for determining an upper bound pipeline stage execution latency; and means for performing a binary search between the lower and upper bound pipeline stage execution latencies for a pipeline stage execution latency that results in the scheduled, optimized execution order.

18. The apparatus of claim 15 further comprising:

means for generating an annotated version of the program specification that indicates the location of each inserted pipeline register.

19. The apparatus of claim 15 wherein the user-created program specification is a graphical model, the apparatus further comprising:

means for generating an annotated version of the graphical model that includes a register block for each inserted pipeline register.

20. The apparatus of claim 15 wherein the user-created program specification is a single block of a graphical model.

* * * * *

UNITED STATES PATENT AND TRADEMARK OFFICE

CERTIFICATE OF CORRECTION

PATENT NO. : 8,402,449 B1
APPLICATION NO. : 11/972117
DATED : March 19, 2013
INVENTOR(S) : Biswas et al.

It is certified that error appears in the above-identified patent and that said Letters Patent is hereby corrected as shown below:

In the Specification

Col. 1, line 23 should read:
modeling environment is an extension to ~~is~~ the Simulink®

Col. 1, line 60 should read:
implementation technique ~~is~~ where multiple instructions or Col. 4, line 20 should read:
may also receive the control file 130 ~~is~~ created by the user or Col. 4, line 61 should read:
model 300 may include a plurality of ~~is~~ blocks 302*a*-1 inter- Col. 7, line 62 should read:
the nodes of ~~is~~ the CDFG. As indicated above, moreover, the In the Claims Col. 14, line 34, claim 6 should read:
6. The method of claim 1 further comprising;~~:~~

Col. 14, line 60, claim 11 should read:
11. A non-transitory computer readable medium comprising instructions Signed and Sealed this
Second Day of July, 2013

Teresa Stanek Rea
*Acting Director of the United States Patent and Trademark Office*